United States Patent
Duensing et al.

(10) Patent No.: US 10,451,691 B2
(45) Date of Patent: Oct. 22, 2019

(54) RADIO FREQUENCY COIL ARRAY HAVING AN INTERNAL OPENING CONFIGURED TO ACCOMMODATE VARIABLE SIZES OF A SUBJECT'S ANATOMY

(71) Applicant: KONINKLIJKE PHILIPS N.V., Eindhoven (NL)

(72) Inventors: George Randall Duensing, Eindhoven (NL); Olli T. Friman, Eindhoven (NL); Charles Albert Saylor, Eindhoven (NL); Ryan Law, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 883 days.

(21) Appl. No.: 14/779,707

(22) PCT Filed: Mar. 17, 2014

(86) PCT No.: PCT/IB2014/059886
§ 371 (c)(1),
(2) Date: Sep. 24, 2015

(87) PCT Pub. No.: WO2014/155234
PCT Pub. Date: Oct. 2, 2014

(65) Prior Publication Data
US 2016/0054404 A1   Feb. 25, 2016

Related U.S. Application Data

(60) Provisional application No. 61/806,116, filed on Mar. 28, 2013.

(51) Int. Cl.
G01R 33/34       (2006.01)
G01R 33/3415    (2006.01)
G01R 33/341     (2006.01)

(52) U.S. Cl.
CPC ..... *G01R 33/34084* (2013.01); *G01R 33/341* (2013.01); *G01R 33/3415* (2013.01); *G01R 33/34046* (2013.01); *G01R 33/34007* (2013.01)

(58) Field of Classification Search
CPC ........ G01R 33/34007; G01R 33/34046; G01R 33/34084; G01R 33/341; G01R 33/3415
See application file for complete search history.

(56) References Cited

U.S. PATENT DOCUMENTS 5,197,474 A      3/1993   Englund
5,277,183 A *    1/1994   Vij .................... A61B 5/0555
                                                            324/318

(Continued)

FOREIGN PATENT DOCUMENTS

JP    63272335 A  * 11/1988   ......... G01R 33/3806
JP    03188830 A  *  8/1991

(Continued)

*Primary Examiner* — Jay Patidar

(57) ABSTRACT

A local magnetic resonance (MR) radio frequency (RF) coil (12, 70, 90) includes a fixed size coil housing (19, 72) with an internal opening (26) which receives a portion of a subject anatomy for imaging. The internal opening (26) includes a narrowed portion (28) and a divergent portion (30) which accommodates variable sizes of subject anatomy. A first size of antenna (84) is disposed in the housing (19, 72) adjacent the narrowed portion (28) of the opening and at least a second size of antenna (86) larger than the at least first sized antenna (84) adjacent the divergent portion of the opening.

18 Claims, 5 Drawing Sheets

(56) References Cited

U.S. PATENT DOCUMENTS

Figure 1:
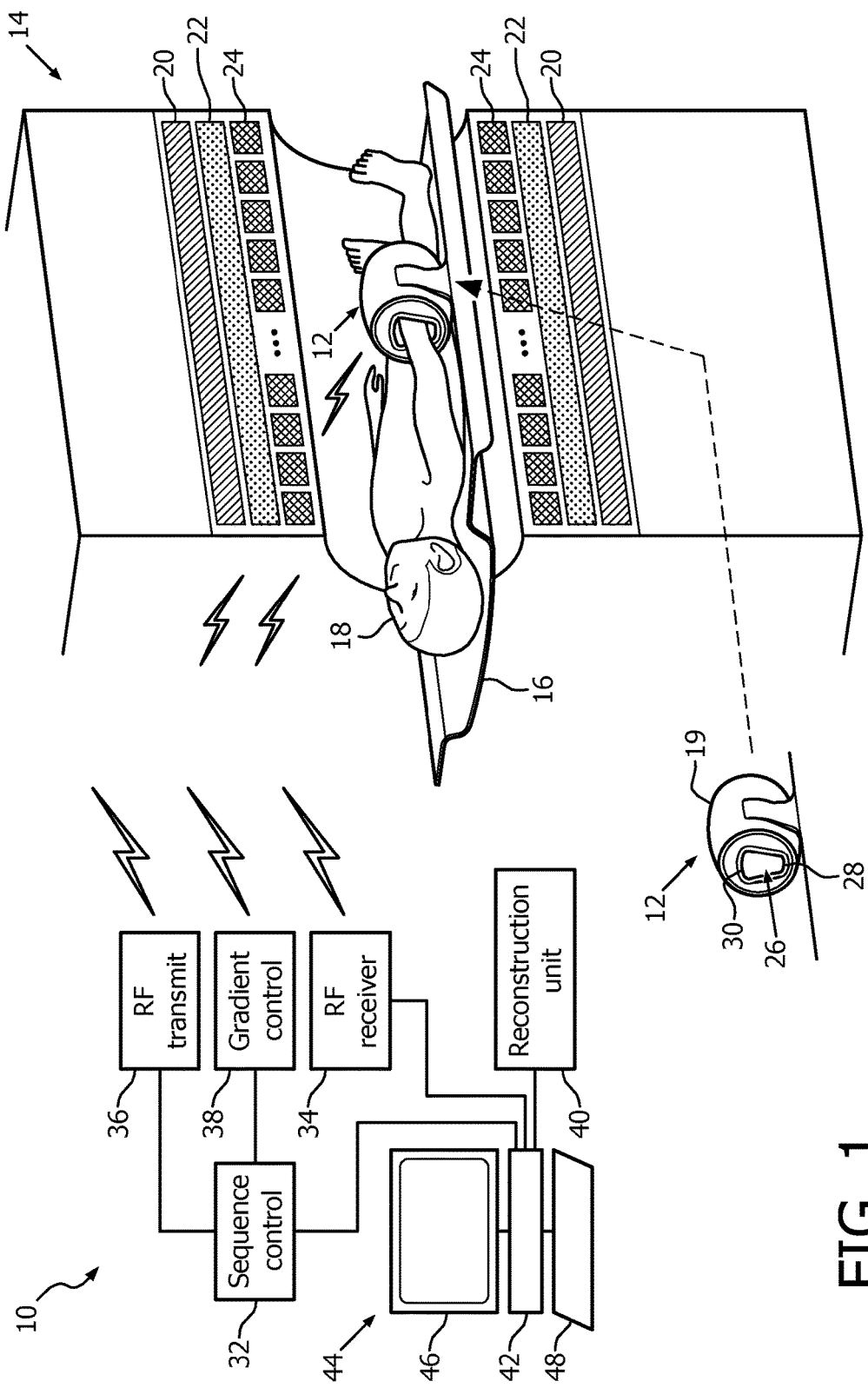

| | | | |
|---|---|---|---|
| 5,307,039 A * | 4/1994 | Chari | G01R 33/3815 |
| | | | 324/318 |
| 5,396,207 A * | 3/1995 | Dorri | G01R 33/3815 |
| | | | 324/318 |
| 5,416,415 A * | 5/1995 | Dorri | G01R 33/3815 |
| | | | 324/318 |
| 5,477,146 A | 12/1995 | Jones | |
| 5,519,321 A * | 5/1996 | Hagen | A61B 5/0555 |
| | | | 324/318 |
| 5,541,515 A * | 7/1996 | Tsujita | A61B 5/0555 |
| | | | 324/318 |
| 5,543,710 A * | 8/1996 | Jones | G01R 33/34053 |
| | | | 324/318 |
| 5,548,218 A | 8/1996 | Lu | |
| 5,646,532 A * | 7/1997 | Knuttel | G01R 33/3815 |
| | | | 324/321 |
| 5,801,609 A * | 9/1998 | Laskaris | G01R 33/421 |
| | | | 324/319 |
| 6,137,291 A | 10/2000 | Szumowksi | |
| 6,229,310 B1 | 5/2001 | Green et al. | |
| 6,313,633 B1 | 11/2001 | Boskamp | |
| 6,438,402 B1 * | 8/2002 | Hashoian | G01R 33/34 |
| | | | 324/318 |
| 6,462,636 B1 | 10/2002 | Overweg | |
| 6,727,701 B1 | 4/2004 | Jevtic | |
| 7,036,169 B2 * | 5/2006 | Marshall | A61B 6/0421 |
| | | | 378/208 |
| 7,230,428 B1 | 6/2007 | Ishii | |
| 7,397,245 B2 | 7/2008 | Wohlfarth | |
| 7,466,133 B2 * | 12/2008 | Havens | G01R 33/3815 |
| | | | 324/319 |
| 7,876,097 B2 | 1/2011 | Greim | |
| 9,084,704 B2 * | 7/2015 | Oberst | A61G 7/075 |
| 2004/0075437 A1 * | 4/2004 | Srinivasan | G01R 33/34046 |
| | | | 324/318 |
| 2006/0055406 A1 * | 3/2006 | Lvovsky | G01R 33/381 |
| | | | 324/318 |
| 2007/0152667 A1 | 7/2007 | Schubert | |
| 2008/0204019 A1 * | 8/2008 | Xue | G01R 33/34053 |
| | | | 324/309 |
| 2009/0088627 A1 | 4/2009 | Piferi | |
| 2010/0315085 A1 | 12/2010 | Brown | |
| 2012/0025833 A1 | 2/2012 | Iwama | |
| 2014/0021949 A1 * | 1/2014 | Heismann | G01R 33/34 |
| | | | 324/307 |
| 2016/0061916 A1 * | 3/2016 | Duensing | G01R 33/34007 |
| | | | 324/309 |

FOREIGN PATENT DOCUMENTS

| | | |
|---|---|---|
| JP | 07327949 A | 12/1995 |
| JP | 0947444 A | 2/1997 |
| JP | 2005253816 A | 9/2005 |
| JP | 2012024114 A | 2/2012 |
| RU | 2400135 CA | 9/2010 |

* cited by examiner

RADIO FREQUENCY COIL ARRAY HAVING AN INTERNAL OPENING CONFIGURED TO ACCOMMODATE VARIABLE SIZES OF A SUBJECT'S ANATOMY

CROSS-REFERENCE TO PRIOR APPLICATIONS

This application is the U.S. National Phase application under 35 U.S.C. § 371 of International Application No. PCT/IB2014/059886, filed on Mar. 17, 2014, which claims the benefit of U.S. Patent Application No. 61/806116, filed on Mar. 28, 2013. These applications are hereby incorporated by reference herein.

The following relates generally to magnetic resonance medical imaging. It finds particular application in conjunction with magnetic resonance (MR) local radio-frequency (RF) coils, and will be described with particular reference thereto. However, it will be understood that it also finds application in other usage scenarios and is not necessarily limited to the aforementioned application.

Local RF coils are often used for imaging extremities of the body such as wrists, forearms, ankles, or knees. Local RF coils can also include head or shoulder coils. Local coils provide improved signal to noise ratios with coils located in close proximity to the body. Local coils include a large, typically round or circular opening to accommodate a largest extremity of the patient population. Movement of the local coil during scanning is minimized by securing the coil in position. Typically a base pad or surface is placed on a subject support and the subject rests on the base pad minimizing movement of the pad. The local RF coil is secured to the base pad. The placement of the base pad and securing the local coil in the proper position is often an iterative process where the subject may have to be removed from the base pad, the base pad repositioned, and the subject moved back onto the base pad until the local RF coil is properly positioned relative to the subject and to a bore opening of an MR scanner. The positioning is varied from subject to subject, and typically different for each subject. The difference between subjects adds to the scanner configuration complexity and can impact the signal to noise ratio (SNR) by different positioning within the MR scanner bore.

Due to the round cross section shape of the local coil, and the size of the opening in the local coil, the subject extremity position in the local coil can vary, which can also affect the signal to noise ratio and resulting image quality. For example, with a wrist coil, one subject may hold a wrist against his/her body or inside surface of the wrist coil nearest to the body, while another subject may rest the wrist on the outside surface of the wrist coil away from the body. One may turn the wrist comfortably to the outside, i.e. palm up, while another may turn the wrist comfortably to the inside, i.e. palm down. The subject extremity may be located anywhere within the rounded area and can vary even for a given subject. Each position interacts differently with the local RF coil.

RF coils provide better SNR when closer to surface of the subject anatomy. In order to provide a comparable SNR as the distance of the RF coil surface from the body increases, a size of the local RF coil element or antenna is increased. However, adding many large antennas in a one size fits all approach is an expensive proposition and is constrained by the size of the coil and placement within the coil housing. An alternative approach to improve on the largest fixed size coil opening includes a building block configurable for stepped sizes. In the building block approach, a local RF coil is configurable with components which assemble into different stepped sizes. A closest, but larger size is configured for each subject, which moves the surface of the RF coil with antennas closer on average to the anatomy of the subject. The building block assembly still leaves a gap between the RF coil surface and subject anatomy for most subjects, but improves the SNR because the average distance between the subject anatomy and the RF coil is reduced. However, building block components are more expensive to build and use connectors between components which are subject to wear and may decrease the SNR. Another approach is a flexible RF coil for continuous range of sizes. The flexible coil provides adjustment to match the RF coil to the size of each subject, but the flexible coil is more fragile than fixed size coils. Flexible coils are more susceptible to damage and breakage.

The following discloses a new and improved multi-zone RF coil array for variable patient sizes which addresses the above referenced issues, and others.

In accordance with one aspect, a local magnetic resonance (MR) radio frequency (RF) coil includes a fixed size coil housing, a first size of antenna, and at least a second size of antenna. The fixed size coil housing defines an internal opening which receives a portion of a subject anatomy for imaging, the internal opening includes a narrowed portion which receives subject anatomy in a predetermined position and a divergent portion which accommodates larger sizes of subject anatomy. The first size of antenna is disposed in the housing adjacent the narrowed portion of the opening. The at least second size of antenna is larger than the at least first sized antenna and disposed in the housing adjacent the divergent portion of the opening.

In accordance with another aspect, a method of magnetic resonance imaging system with a local MR radio frequency coil includes locating a subject on a subject support which moves the subject into an imaging region of a magnetic resonance scanner for diagnostic imaging using the local MR RF coil. An anatomical portion of the subject is received into an opening defined in a fixed size housing of the local MR RF coil which includes a narrowed portion opening with at least a first sized antenna, the narrowed housing opening holding the subject received anatomical portion in a predetermined position, and a divergent portion of the housing with at least a second sized antenna greater than the at least first sized antenna. The received anatomical portion of the subject is imaged using the local MR RF coil.

In another aspect, a local magnetic resonance (MR) radio frequency (RF) coil includes a fixed size coil housing with a wedge shaped internal opening, at least a first sized RF antenna, and at least a second sized RF antenna. The fixed size coil housing receives a portion of a subject anatomy, and the wedge shaped internal opening includes a narrowed portion and a divergent portion. The at least a first sized RF antenna is located in the housing adjacent the narrowed portion. The at least a second sized RF antenna is larger than the at least first sized antenna and is located in the housing adjacent the divergent portion.

One advantage is a fixed size local RF coil which holds variable size subject anatomy with an improved SNR.

Another advantage is a fixed size local RF coil with antennas sized to increase as the size of the anatomy increases.

Another advantage resides in RF coils which hold a subject anatomy in a reproducible position within the local coil.

Another advantage resides in the ease of positioning the local RF coil on a subject.

Another advantage includes positioning the local RF coil in a reproducible position in the scanner.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of an MR system with a multi-zone RF coil.

Figure 2A:
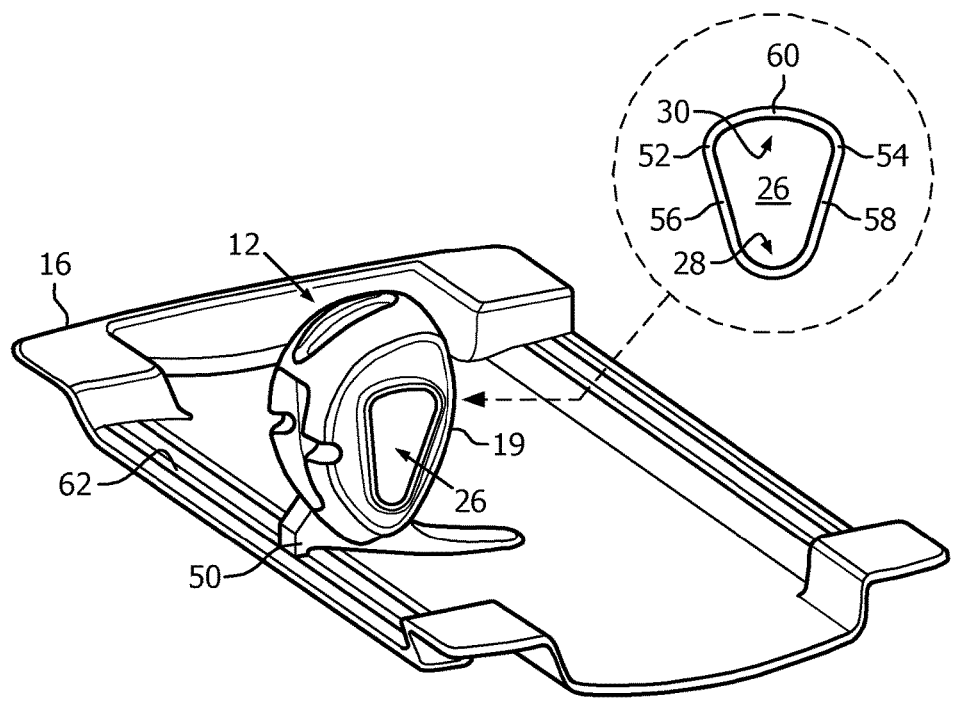

FIG. 2A schematically illustrates one embodiment of a multi-zone RF wrist coil connected with a positioner.

Figure 2B:
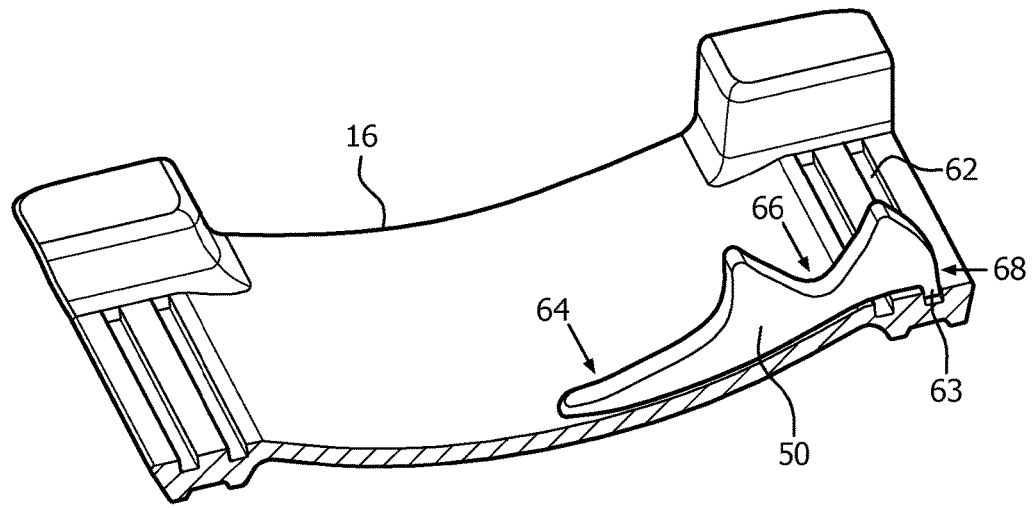

FIG. 2B schematically illustrates one embodiment of the RF coil positioner.

Figure 3A:
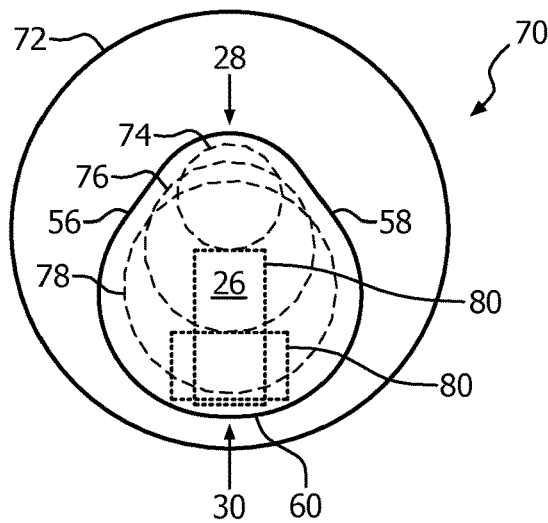
Figure 3B:
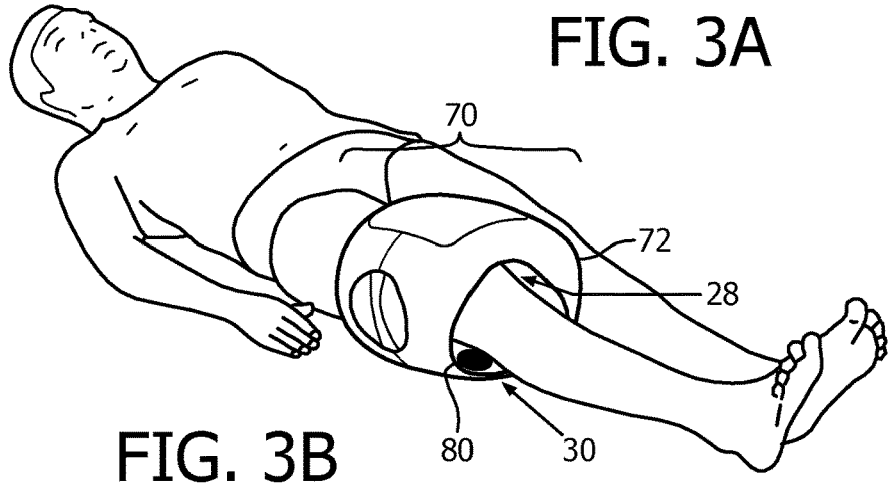
Figure 3C:
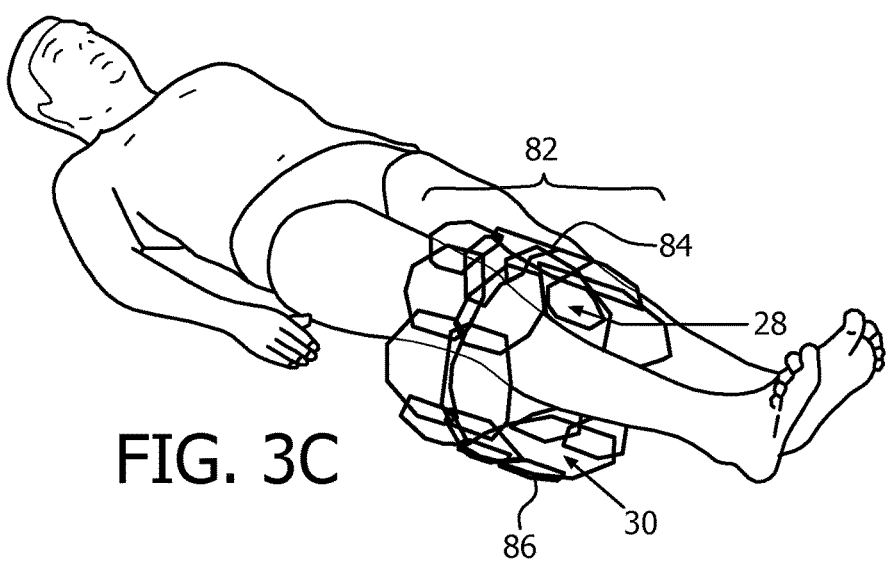

FIG. 3A-3C schematically illustrates one embodiment of a multi-zone RF knee coil.

Figure 4A:
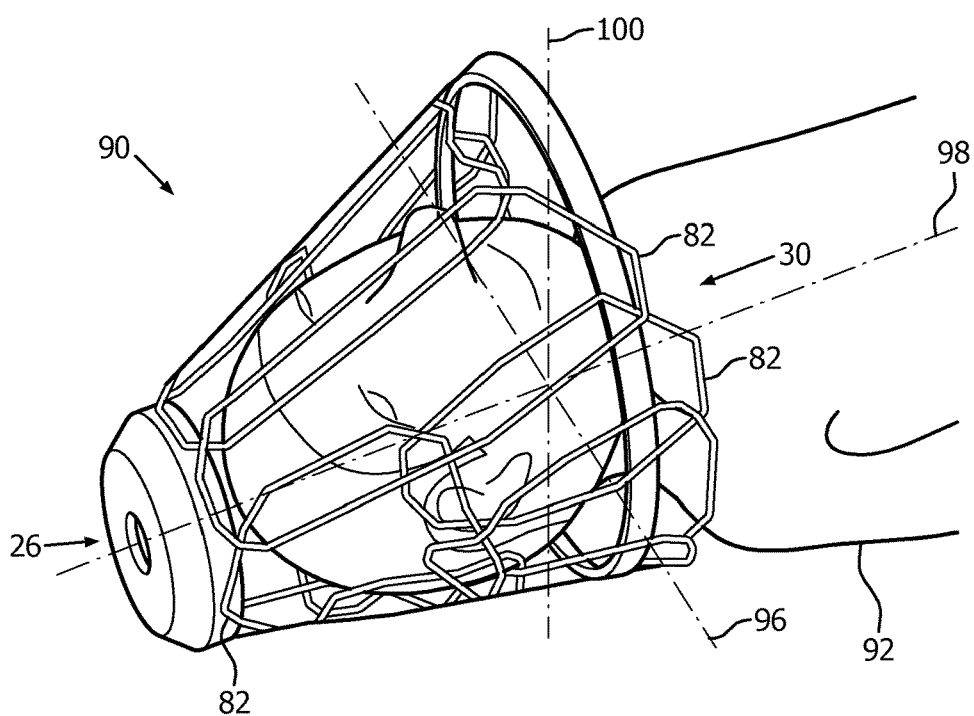
Figure 4B:
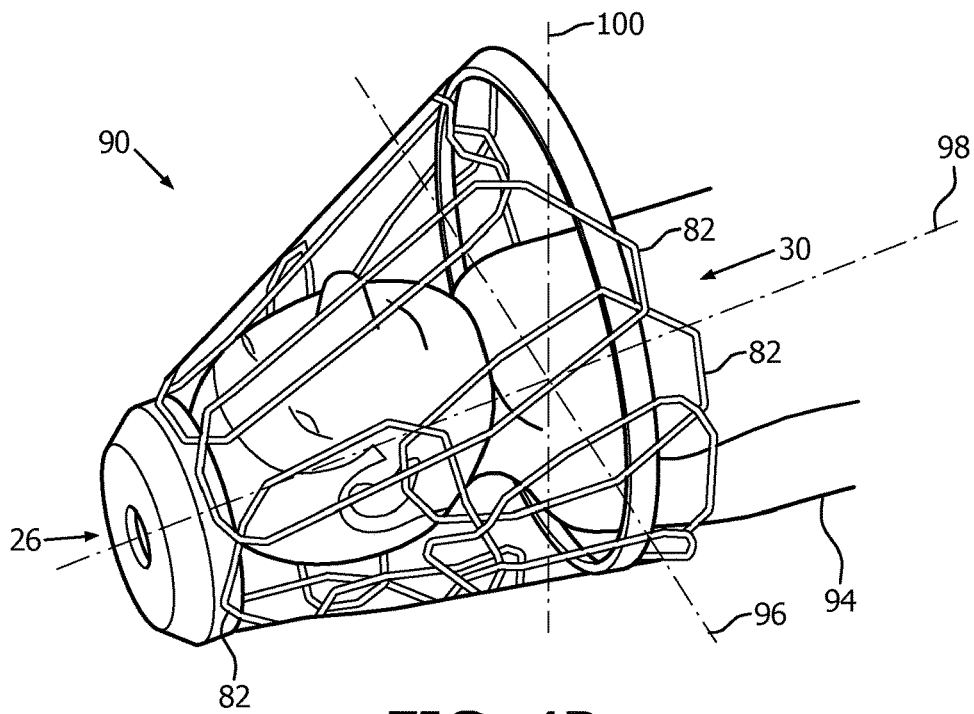

FIG. 4A-4B schematically illustrates one embodiment of a multi-zone RF head coil.

Figure 5:
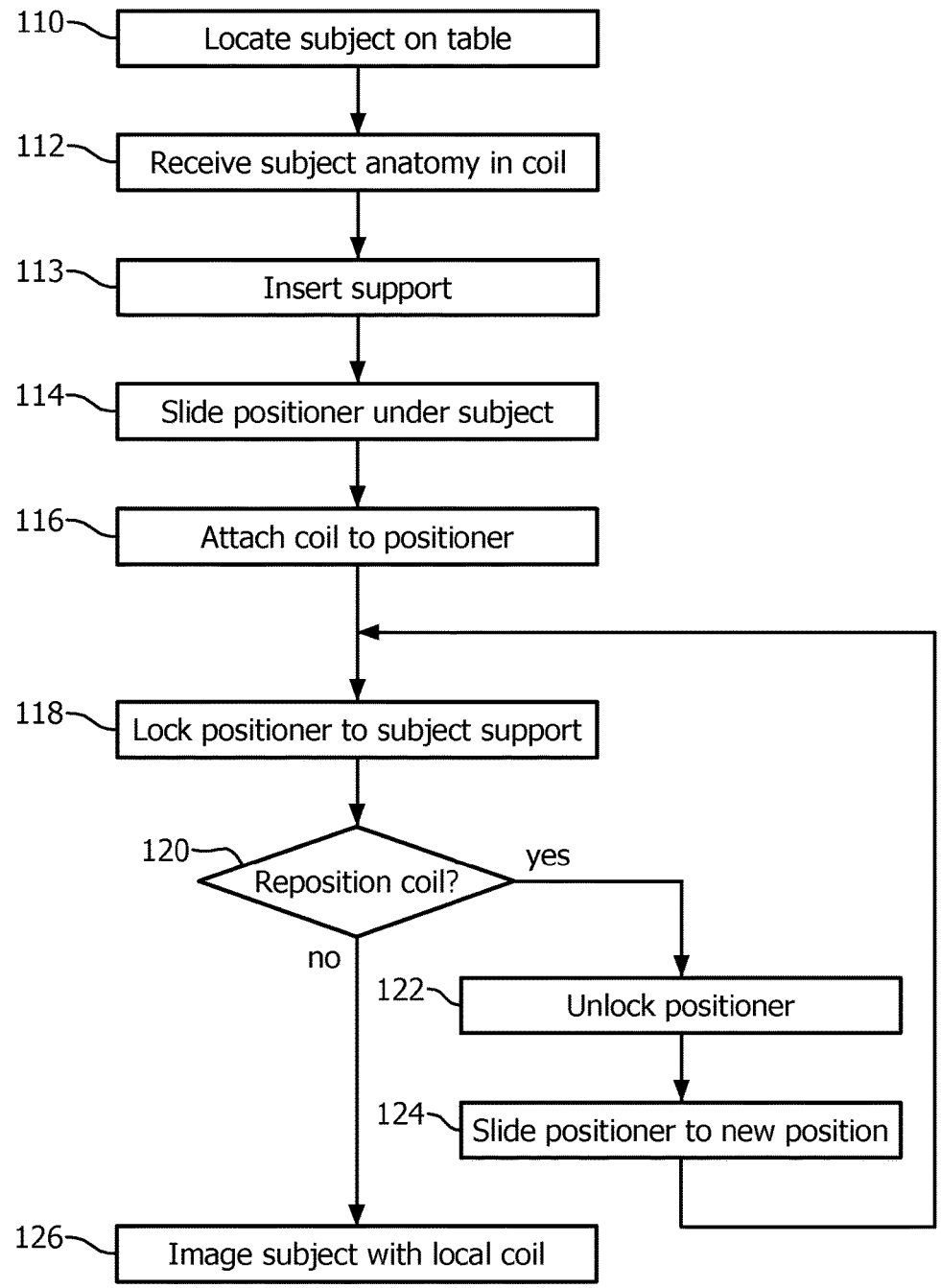

FIG. 5 flowcharts a method of using an embodiment of a multi-zone RF coil.

With reference to FIG. 1, an embodiment of an MR system 10 with a local multi-zone RF coil 12 schematically illustrated. The MR system includes a MR scanner 14 illustrated in cross section with a static $B_0$ main field such as a horizontal bore scanner, open system scanner, c-type scanner, vertical field scanner, and the like. The MR scanner includes a subject support 16 such as a horizontal bed or couch which supports a subject 18 and moves the subject into the MR scanner bore and static field during imaging. The MR scanner 14 includes a main magnet 20 whose poles generate the static main field ($B_0$) such as a horizontal main field. The MR scanner further includes one or more gradient coils 22 for applying gradient fields for manipulating resonance in the tissues of the subject. The MR scanner includes one or more RF coils 24 which generate RF pulses to excite magnetic resonance in the subject 18 such as a transmit mode and can pick-up resonance signals from the subject in a receive mode. The local RF coil 12 includes coils which pick-up or receive resonance signals from the subject in the receive mode and in some embodiments can operate in the transmit mode.

The local RF coil 12 includes a fixed sized housing 19 with an internal opening 26 which receives a portion of the subject anatomy such as a wrist, forearm, ankle, knee, shoulder or head. The internal opening can include a wedge, triangular, ovoid, egg-shaped, and/or arch shape. The fixed sized housing with the internal opening 26 includes a plurality of antenna sizes. The housing includes a narrowed portion 28 that includes at least a first sized antenna adjacent to the housing opening, and a divergent portion 30 which includes at least a second sized antenna larger than the first size antenna. The local RF coil can include additional intermediate antenna sizes which are disposed in the housing. The antenna are disposed to provide greater penetration with larger antenna as opening size increases toward the divergent portion, and smaller antenna toward the narrowed portion. The narrowed portion of the housing is sized to hold the receive portion of anatomy in a predetermined position. The holding restricts lateral variation and movement during imaging. The holding improves the repeatable positioning of the subject portion of anatomy with a natural intersection of two surfaces or v-shape which promotes a particular position. For example, a wrist coil receives a subject wrist anatomically structured with an ulna and a radius, and the narrowed portion is oriented beneath the ulna. The wrist naturally rests with the ulna centered in the narrowed portion or toward the intersection of the two surfaces. The divergent portion is sized to accommodate variable sizes of anatomy, e.g. from a small wrist to large wrist fit between the two divergent surfaces and between the two divergent surfaces and the third surface which connects to each of the two surfaces. For example, a smaller wrist will be positioned a greater distance from the divergent portion 30 and a lesser distance from the narrowed portion 28 of housing than a larger wrist. The larger wrist can be accommodated closer to the divergent portion 30 of the internal opening where the spread of the divergent side walls of the opening conform to the width of the wrist. However, both a small and a large wrist will naturally rest against and centered between the diverging side walls of the opening.

The system 10 includes a sequence controller 32 and a RF receiver unit 34. The sequence controller controls the operation of the imaging sequence which includes a RF transmitter unit 36 controlling the operation of the RF coils 24 and/or the local RF coil 12 and a gradient controller 38 controller the operation of the gradient coils 22. The communication between the controlling unit and the corresponding coils can be wireless or wired. The RF transmitter unit 36 works cooperatively with the local coil 12 when configured as a transmit/receive coil. The RF receiver 34 receives RF data from the local RF coil 12 indicative of the magnetic resonance excited in the tissue of the subject. The RF data can be communicated between the local RF coil and the RF receiver wirelessly or a wired connection. With a wireless connection, power can used from an induced current or a separate power source to transmit RF data. With a wired connection, the wire can optionally supply power for amplification and carry the resonance signal. A reconstruction unit 40, embodied as a configured processor such as a processor 42 of a workstation 44, receives RF data from the RF receiver 34 and reconstructs one or more images from the received data.

The workstation 44 includes the electronic processor or electronic processing device 42, a display 46 which displays the reconstructed image, menus, panels, and user controls, and the at least one input device 48 which inputs a healthcare practitioner selections. The workstation 44 can be a desktop computer, a laptop, a tablet, a mobile computing device, a smartphone, and the like. The input device 48 can be a keyboard, a mouse, a microphone, and the like. The reconstruction unit is suitably embodied by an electronic data processing device, such as the electronic processor or electronic processing device 42 of the workstation 44, or by a network-based server computer operatively connected with the workstation 44 by a network, or so forth. Moreover, the reconstruction technique is suitably implemented using a non-transitory storage medium storing instructions (e.g., software) readable by an electronic data processing device and executable by the electronic data processing device.

With reference to FIG. 2A, one embodiment of the multi-zone local RF wrist coil 12 connected with a positioner 50 is illustrated in perspective. The local wrist coil includes the narrowed housing opening 28 sized to receive and hold a wrist of the subject closest to the ulna and/or little finger. The local wrist coil can be used interchangeably on either side of the subject and subject support 16. The opening in the housing is oriented with the triangular shape inverted and an apex toward the narrowed portion and the base toward the divergent portion. The triangular shape is oriented perpendicular to the axis of the subject. The vertices of the narrowed portion 28 and adjacent corners 52, 54 are ergonomically rounded. For example, two surfaces 56, 58 meet in the narrowed portion 28 to form a rounded v-shape, which can follow the lower contour of a typical pediatric or other small wrist. The two surfaces opposite the narrowed portion diverge and meet with a third surface 60 with rounded vertices to form the divergent portion 30, which can follow the contour of the upper surface of a typical very large wrist. The orientation of the two surfaces which join to form the divergent portion can include different orientations relative to the vertical axis. For example, the surface which includes an outside surface relative to the subject support and subject such as the back of the hand can include a more vertical orientation than an inside surface relative to the subject support and subject such as the palm. The triangular shape can include asymmetric shapes. The asymmetric triangular shape provides for an opening through which a hand can easily pass with a base of the hand with a little finger at the narrowed portion, a knuckle of a first finger at a second vertex 52, and a thumb at a third vertex 54. After the hand passes through the opening, the wrist naturally rests in the narrowed portion, inverted apex, or rounded portion where the two surfaces 56, 58 join. The orientation and position of the wrist relative to the wrist coil is determined by the shape of the housing and the size of the wrist.

The positioner 50 holds the local RF coil in a predetermined position relative to the subject support. The positioner can be integrated with the RF coil or configured to be securely connected to and released from the RF coil. The positioner connects the local RF coil to the subject support using a groove or channel 62 in the subject support. The positioner when connected fixes the local RF coil a predetermined orientation and distance from the edge of the subject support which can be preconfigured within the imaging system 10. The shape of the local RF coil prevents movement of the portion of the subject anatomy being imaged such as the wrist relative to the coil. With both the local RF coil and the subject anatomy immobilized and in a predetermined position, reproducible positions within the local coil can be achieved. The fixed size local RF coil accommodates multiple sizes of subject anatomy in a predetermine position within the local RF coil, and provides for positioning of the local RF coil in a predetermined position relative to the edge of the subject support. The positioning of the local RF coil with the subject anatomy in a predetermined position relative to the edge of the subject support and scanner positions the RF coil in a defined position in the scanner which provides for easier tuning and imaging of the portion of the subject anatomy relative to the field of view of the MR scanner.

With reference to FIG. 2B, one embodiment of the RF coil positioner 50 is illustrated in a perspective view with a portion of the subject support 16. The positioner 50 includes a rigid structure constructed with MR inert material. The positioner includes a contoured first section 64 which slides and extends under a portion of the subject such as a side of a torso of the subject. The first section is anchored in place by the weight of the subject resting on the first portion between the subject and the subject support. The positioner is sized such that the positioner slides under the subject resting on the subject support 16. The first portion is configured to be comfortable to the subject. For example, the first portion extends under only a portion of the subject anatomy such as less than or equal to mid-center, and is constructed to conform to the shape of the subject support with a minimal thickness which can comfortably be placed between the subject and the subject support. In one embodiment, the first portion flexes to the weight of the subject and shape of the subject support. The positioner includes a second section 66 which attached to and holds the local RF coil 12 in a fixed position. In one embodiment, the local RF coil 12 and the positioner are detachable. In another embodiment such as FIG. 2A, the positioner is integrated into the housing of the local RF coil. The local RF coil and the positioner can be attached/detached using MR inert pins, screws, posts, straps, and the like. The positioner 50 includes a third section 68 which is received in the channel or groove 62 of the subject support 16. A protrusion 63 of the third section mates with the groove 62, which fixes the distance of the RF coil from a central axis of the subject support. The second section 66 holding the local RF coil is longitudinally held in place by the weight of the subject, and transversely held in place by the interaction between the projection 63 and the groove 62. With both ends of the positioner positioned and the local RF coil attached to the positioner, the RF local coil is positioned in a reproducible position in the scanner. Furthermore, with the configuration of the positioner, the local RF coil is easily positioned while the subject remains at rest on the subject support.

With reference to FIG. 3A, one embodiment of a multi-zone RF knee coil 70 is diagrammatically illustrated in a front view. The knee coil includes the fixed size housing 72 with an opening which includes the narrowed portion 28 and the divergent portion 30. The narrowed portion is shown oriented up with a rounded vertex from the joining of two faces 56, 58 of the inside of the housing surface. The divergent portion includes the third surface shape more rounded as an arch or broad u-shape. A knee of the subject is placed in the opening of the housing with the patella oriented into and close to the narrowed portion and the medial and lateral collateral ligaments oriented opposite the narrowed portion and toward the divergent portion. The knee coil can be used interchangeably with either side knee of the subject. The fixed sized housing opening accommodates variable sizes of subject knees or zones such as a small size knee 74, medium size knee 76, or a large sized knee 78. The narrowed portion is sized for the anatomy of the small knee near the patella positioned to rest comfortably closest to the narrowed portion 28. The divergent portion 30 is sized to allow a foot and lower leg to slide through the opening until the knee is located within the opening of the housing. With the subject positioned face-up on a subject support, the patella can be positioned closest to the narrowed portion 30 using a support 80 such as a block, pad, and the like. For example, an inflatable pad can be used to raise the position of the knee within the opening to position the patella close to the narrowed portion 30.

With reference to FIG. 3B, one embodiment of a multi-zone RF knee coil 70 is shown in perspective with the subject knee received and with the other leg not shown. The subject is oriented face up and the local RF knee coil is oriented with the narrowed portion 28 up. The support 80 is placed between the subject knee and the divergent portion 30 of the housing opening. In another embodiment, the subject is faced down and the local RF knee coil 70 is oriented with the narrowed portion 28 beneath the subject knee which allows the knee to rest in the narrowed portion with gravity.

FIG. 3C schematically illustrates one embodiment of a multi-zone RF knee coil antenna array 82. The antenna array 82 is located internal to the local coil housing. The antenna array 82 includes a plurality of antenna sizes. The array includes at least a first sized antenna 84 adjacent to the narrowed portion 82 of the opening. The array includes at least a second sized antenna 86 adjacent the divergent portion 30 of the opening. The second sized antenna is larger than the first sized antenna for sensitivity to more distal resonance. The embodiment shows additional antenna. The antenna can be increased or decreased in size according to the position relative to the distance between the surfaces which form the divergent portion or wedge shape opening. The size increases as the divergence increases or the distance to penetrate the subject anatomy increases. In one embodiment, the change in the antenna size from the at least first size to the at least second size increases proportionally to the change in opening size from the narrowed portion to the divergent portion of the housing opening.

FIG. 4A-4B schematically illustrates one embodiment of a multi-zone RF head coil 90 with the subject and with the housing removed to show the coil array. The subject with a large head size 92 is shown in reference to FIG. 4A. The subject with a small head size 94 is shown in reference to FIG. 4B. The subjects are shown in a supine position or face up position, with the narrowed portion 26 of the head coil oriented at the top of the head, and the divergent portion 30 along an axis 96 oriented from the front of a face to the back of the spine. The narrowed portion relative to the divergent portion is oriented along the longitudinal axis of the body 98. The wedge shape includes two surfaces of the housing which form the wedge shape with the divergent portion 30 left open, e.g. space between the face and the spine. The wedge shape includes a conical shape or triangular pyramidal shape which includes divergence toward an axis 100 oriented between the shoulders or space between the shoulders along axis 96. For example, with the narrowed portion 26 representing a vertex of a triangular pyramid and the divergent portion including the base of the triangular pyramid with vertices at each of the shoulders and the centerline of the face, e.g. tip of the nose, chin, etc. The subject is received into the local RF coil with the head positioned near the narrowed portion of the local coil. For example, the top of head slides as far as the head coil permits. With the larger subject 92 of FIG. 4A, the head coil internal opening receives the head. With the smaller subject 94 of FIG. 4B, the head coil internal opening receives the head and a portion of the shoulders. The antenna array 82 includes a smaller antenna size towards the narrowed portion of the head, and larger antenna size towards the shoulders and/or chin. Because the head rests on the downward portion and the upward portion may be spaced from the face to avoid a claustrophobic reaction, the largest coils can be in the upper portion of the head coil 90.

With reference to FIG. 5, a method of using an embodiment of a multi-zone RF coil is flowcharted. In a step 110, the subject is located on the subject support which moves the subject into the bore of a magnetic resonance scanner for diagnostic imaging using the multi-zone local RF coil such as the wrist coil, the knee coil, the head coil, a forearm coil, a shoulder coil, an ankle coil, and the like. The subject can be in the supine position, prone position, etc. An anatomical portion of the subject is received into a fixed sized housing with an opening of the multi-zone local RF coil in a step 112. The housing opening can include a wedge shape, a triangular shape, an arched shape, a pyramidal shape, and the like. The portion of the subject anatomy can include an extremity, a shoulder, or a head. The local RF coil includes a narrowed portion of the housing opening with at least a first sized antenna and the narrowed housing holds the received subject anatomical portion in a determined position. The subject anatomy located in the housing opening is positioned with the subject anatomy close to the narrowed portion of housing opening. For example, with a wrist coil includes the narrowed housing opening sized to receive and hold the subject anatomy of a wrist or forearm closest to an ulna and/or little finger, or a knee coil includes the narrowed housing opening sized to receive and hold a subject anatomy of a knee closest to a patella. Other examples include a shoulder coil with the narrowed housing opening sized to receive and hold the subject anatomy of a distal edge of the shoulder; a head coil with the narrowed housing opening sized to receive and hold the subject anatomy of the top of the head; or an ankle coil with the narrowed housing opening sized to receive and hold the subject anatomy of an ankle closest to an Achilles tendon.

The local RF coil includes a divergent portion of the housing with at least a second sized antenna greater than the at least first sized antenna. The divergent portion is sized to accommodate a variety of subject sizes. In one embodiment, a method includes a step 113 which includes inserting an MR inert support such as a pad, block, or the like between the divergent opening and the received subject anatomy to hold the subject anatomy in position within the local RF coil, e.g. closest to the narrowed portion of the housing opening. The pad can be an inflatable pad which is inserted between the subject anatomy and the inside facing of the divergent portion of the housing opening and inflated until the subject anatomy rests close to the narrowed portion of the housing opening.

A positioner is positioned in a step 114. The positioner slides and extends under a portion of the subject while the subject is located on the subject support. In a step 116, the positioner is attached to the local RF coil. In one embodiment, the positioner is integrated into the housing of the local RF coil which is already attached. The positioner is positioned on the subject support in a step 116. The positioner can held in position by a healthcare practitioner pushing the contoured first section 64 under the patient until the projection 63 is received in the channel 62. In another embodiment, a locking mechanism includes a locking lever employed to lock the projection in the channel 62. The locking mechanism can be operated without tools. The locking mechanism holds the local RF coil in a fixed position relative to an edge of the subject support.

In a decision step 120, the healthcare practitioner can decide to reposition the local RF coil. The decision can include the placement relative to the subject, e.g. to provide greater comfort, or to move the local RF coil relative to the receive subject anatomy, e.g. better placement for imaging. In a step 122, to reposition the positioner and local RF coil, the positioner is detached or unlocked from the subject support. The positioner is repositioned in a step 124 by sliding the position of the positioner under the subject to a new position. The positioner is re-attached or re-locked returning to an earlier step 118. Thus, the steps can be repeated until the healthcare practitioner is satisfied with the placement of the positioner and attached local RF coil.

The MR scanner operates with the local RF coil in a step 126, to image the subject anatomy received in the local RF coil. In one embodiment, the local RF coil operates in both a transmit mode and a receive mode. In another embodiment, the local RF coil operates only in a receive mode. The imaging data is reconstructed into an image which can be displayed on the display device and/or stored in a storage management system or storage device.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A local magnetic resonance radio frequency coil comprising:
    a fixed size coil housing defining an internal opening having a transverse cross-section, the internal opening including a narrowed portion having a narrower transverse cross-section and a divergent portion having a wider transverse cross-section, wherein the internal opening is configured to receive a portion of a subject anatomy for imaging;
    wherein the narrowed portion of the opening with the narrower transverse cross-section is configured to receive a smaller portion of the subject anatomy in a predetermined position in the opening and the divergent portion which is configured to accommodate larger sizes of the subject anatomy;
    a first antenna or antenna portion disposed in the housing and configured to conform to the narrowed portion of the opening;
    at least a second antenna or antenna portion disposed in the housing and configured to conform to the divergent portion of the opening; and
    a positioner configured to be integrated with the housing of the RF coil and configured to slide longitudinally along a subject supporting structure to position the magnetic resonance radiofrequency coil longitudinally relative to a subject;
    wherein the positioner includes a first section configured to slide under a portion of the subject while the subject is supported by the subject supporting structure, a second section connected to the first section configured to attach to the magnetic resonance radio frequency coil, and a third section connected to the second section and configured to position the coil in a selected position relative to an edge of the subject supporting structure.

2. The magnetic resonance radio frequency coil according to claim 1, wherein the third section of the positioner further includes a projection configured to be received in a groove extending longitudinally adjacent an edge of the subject supporting structure.

3. A method of magnetic resonance imaging using a magnetic resonance radio frequency coil, comprising:
    locating a subject prone on a subject support which moves the subject horizontally into an imaging region of a magnetic resonance scanner for diagnostic imaging of a limb of the subject using the magnetic resonance radio frequency coil, the magnetic resonance radio frequency coil being supported on the subject support with an egg-shaped limb receiving opening being disposed vertically;
    receiving the limb of the subject in the egg-shaped opening, the opening being defined in a fixed size housing of the magnetic resonance radio frequency coil, the vertical, egg-shaped opening comprising a narrow portion and a divergent portion, the narrow portion of the vertical opening being narrower than the divergent portion, the opening being surrounded by antenna portions;
    positioning the limb vertically as far into the vertical, egg-shaped narrow portion of the opening as the limb fits to minimize a distance between the limb and adjacent antenna portions; and
    imaging the received limb of the subject using the magnetic resonance radio frequency coil.

4. The method according to claim 3, positioning the limb includes:
    sliding a first section of a positioner under a limb of the subject,
    attaching the positioner to the subject support, and
    attaching the magnetic resonance radio frequency coil to the positioner to hold the magnetic resonance radio frequency coil in a fixed position relative to the subject support.

5. The method according to claim 3, further comprising:
    inserting a support between the divergent opening and a portion of the received limb to hold the received limb in the position as far into the narrow portion of the vertical, egg-shaped opening of the magnetic resonance radio frequency coil as far as the limb fits.

6. The method according to claim 4, further comprising:
    repositioning at least one of the positioner and the magnetic resonance radio frequency coil by detaching the positioner from the subject support, sliding the position of the positioner under the subject to a new position and reattaching the positioner to the subject support.

7. A magnetic resonance radio frequency coil comprising:
    a fixed size coil housing with a triangular-shaped entrance opening configured to receive a portion of a subject anatomy, the triangular-shaped entrance opening comprising a narrowed portion and a divergent portion;
    at least a first sized radio frequency antenna located in the housing adjacent the narrowed portion; and
    at least a second sized RF antenna larger than the at least first sized antenna and located in the housing adjacent the divergent portion.

8. The magnetic resonance radio frequency coil according to claim 7, wherein the triangular-shaped entrance opening is transverse to a longitudinal axis of an interior volume of the magnetic resonance radio frequency coil and is configured to receive a smaller sized portion of the subject anatomy adjacent the narrow portion and further from the divergent portion and to receive a larger sized portion of the subject anatomy further from the narrower portion and closer to the divergent portion.

9. The magnetic resonance radio frequency coil according to claim 8, wherein the first and second size radio frequency antennas taken together extend circumferentially around the longitudinal axis.

10. The magnetic resonance radio frequency coil according to claim 7, wherein the triangular-shaped entrance opening is configured to receive the portion of the subject anatomy which includes one of: an ankle, a forearm, a head, a knee, a shoulder, or a wrist.

11. The magnetic resonance radio frequency coil according to claim 7, further comprising:
a rigid coil positioner of inert MR material which includes a first section configured to slide under a portion of the subject anatomy while the subject is supported by a subject support,
a second section connected to the first section configured to attach to the magnetic resonance radio frequency coil, and
a third section connected to the second section configured to position the positioner relative to an edge of the subject support.

12. A local magnetic resonance (MR) radio frequency (RF) coil comprising:
a fixed size coil housing which defines an internal opening which receives a portion of a subject anatomy for imaging, the internal opening includes a narrowed portion which receives subject anatomy in a predetermined position and a divergent portion which accommodates larger sizes of subject anatomy, wherein the narrowed portion and the divergent portion are arranged in a common virtual plane comprising a transverse cross-sectional area of the internal opening;
a plurality of antenna sections disposed in the housing peripherally around the opening, the antenna sections having a smaller size adjacent a periphery of the narrowed portion of the opening and a larger size adjacent the divergent portion of the opening.

13. The magnetic resonance radio frequency coil according to claim 12, wherein the transverse cross-section of the opening includes at least one of a wedge shape, a triangular shape, egg shape, or an arched shape.

14. The magnetic resonance radio frequency coil according to claim 12, further including:
a positioner configured to be integrated with the housing of the RF coil and configured to slide longitudinally along a subject support to position the magnetic resonance radiofrequency coil longitudinally relative to a subject.

15. The magnetic resonance radio frequency coil according to claim 12, further comprising:
an MR inert support configured to be placed between the divergent portion and the subject anatomy to position the subject anatomy in the narrowed portion of the opening.

16. The magnetic resonance radio frequency coil according to claim 12, wherein the magnetic resonance radio frequency coil is a wrist coil with the transverse cross-section of the narrowed housing opening portion sized to receive and hold the subject anatomy of a wrist or forearm closest to an ulna and/or little finger.

17. The magnetic resonance radio frequency coil according to claim 12, wherein the magnetic resonance radio frequency coil is a knee coil with the transverse cross-section of the narrowed housing opening portion sized to receive and hold the subject anatomy of a knee closest to a patella.

18. The magnetic resonance radio frequency coil according to claim 12, wherein the opening is disposed transverse to a longitudinal axis of the coil.

* * * * *